US006627496B1

(12) United States Patent
Schindler et al.

(10) Patent No.: US 6,627,496 B1
(45) Date of Patent: Sep. 30, 2003

(54) PROCESS FOR PRODUCING STRUCTURED LAYERS, PROCESS FOR PRODUCING COMPONENTS OF AN INTEGRATED CIRCUIT, AND PROCESS FOR PRODUCING A MEMORY CONFIGURATION

(75) Inventors: Günther Schindler, München (DE); Walter Hartner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/374,893

(22) Filed: Aug. 13, 1999

(30) Foreign Application Priority Data

Aug. 13, 1998 (DE) .......................... 198 36 751

(51) Int. Cl.[7] ...................... H01L 21/8242; H01L 21/20
(52) U.S. Cl. ........................ 438/253; 438/396
(58) Field of Search ................. 438/253, 396, 438/692, FOR 430

(56) References Cited

U.S. PATENT DOCUMENTS

| 5,366,920 A | 11/1994 | Yamamichi et al. |
| 5,691,229 A | 11/1997 | Okamura et al. |
| 5,793,076 A | 8/1998 | Fazan et al. |

FOREIGN PATENT DOCUMENTS

| EP | 0 385 573 A2 | 9/1990 |
| JP | 58-153375 | 9/1983 |
| JP | 64-1281 | 1/1989 |

OTHER PUBLICATIONS

D. Widmann et al.: Technologie hochintegrierter Schaltungen [technology of highly integrated circuits], Springer Verlag, 2nd ed., 1996, pp. 29, 101–102, 166–168.

*Primary Examiner*—Olik Chaudhuri
*Assistant Examiner*—Thanh Pham
(74) *Attorney, Agent, or Firm*—Laurence A. Greenberg; Werner H. Stemer; Ralph E. Locher

(57) ABSTRACT

A process for producing structured layers on a base body, in particular a semiconductor body, includes the steps of providing a first layer, structuring the first layer with a partial or complete local layer erosion to form raised and recessed layer regions, and depositing a second layer. The structured first layer is a provided as a permanently remaining layer. Edges are formed at transitions from raised to recessed layer regions. The height difference at the edges of the structured first layer separates individual layer regions of the second layer. The edges of the raised regions act as partition edges for the second layer. A process for producing components of an integrated circuit and a process for producing a memory configuration are also provided.

27 Claims, 4 Drawing Sheets

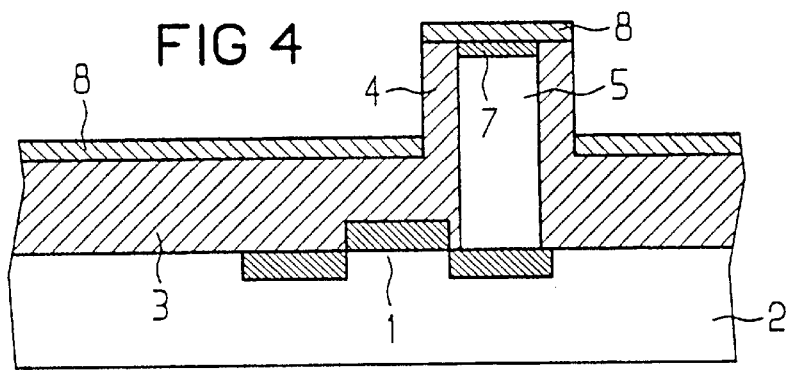
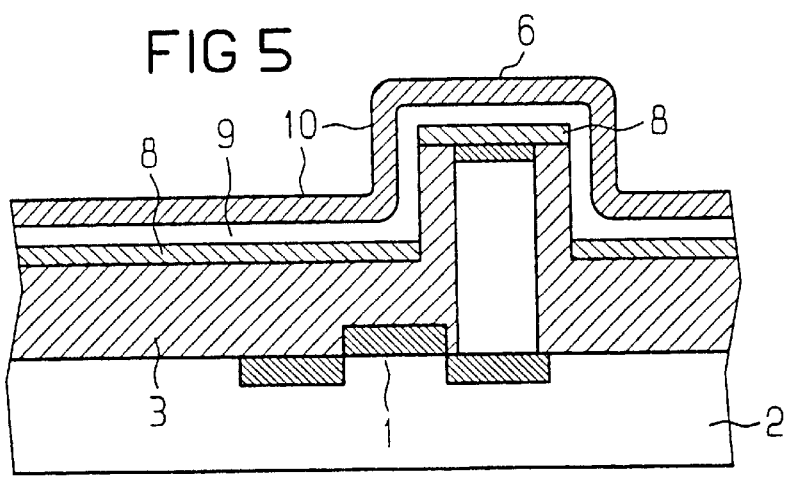
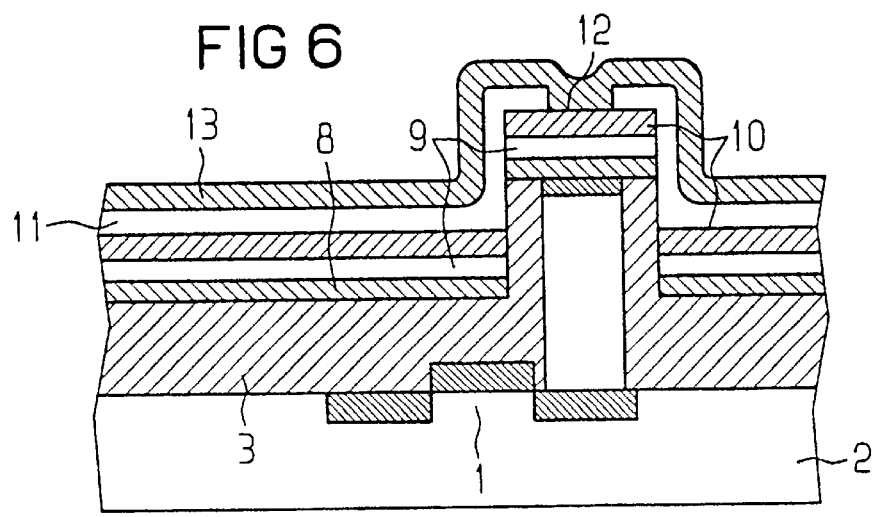

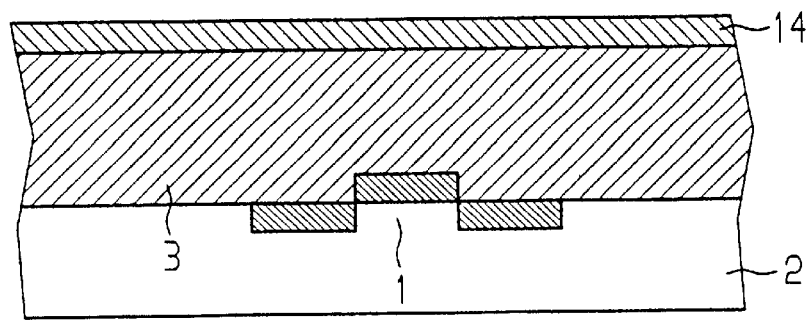
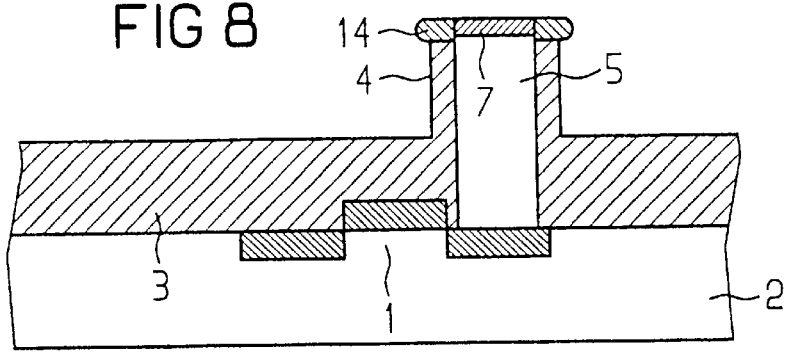
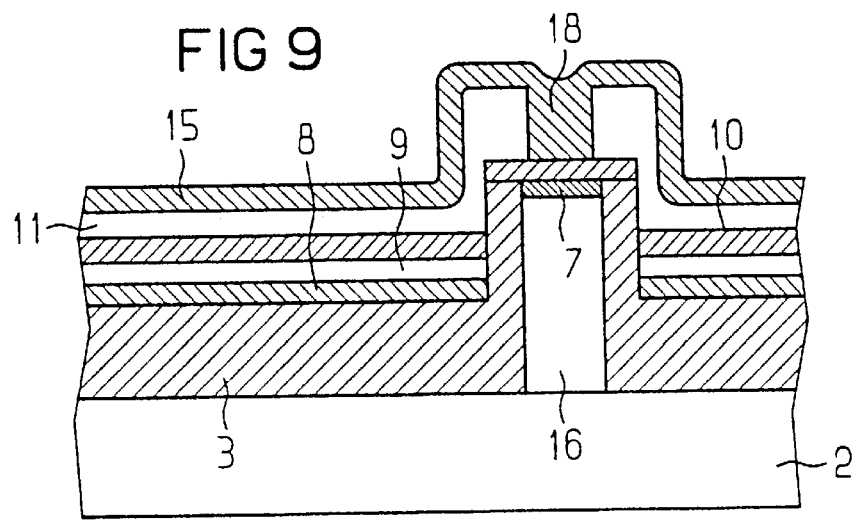

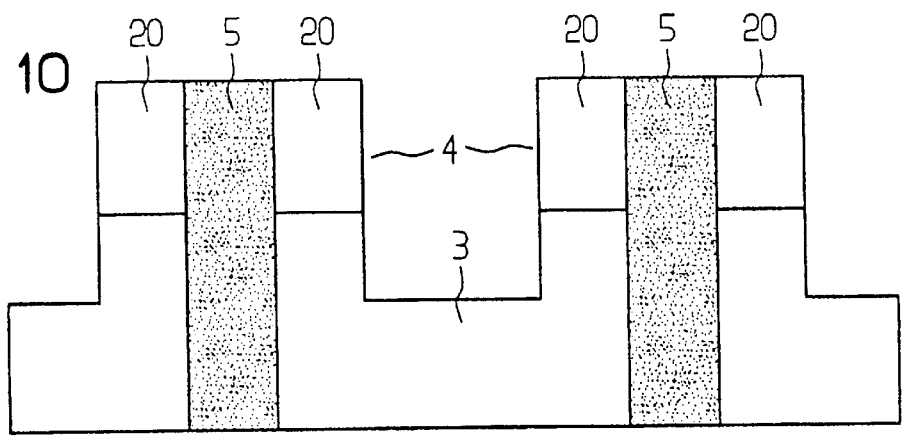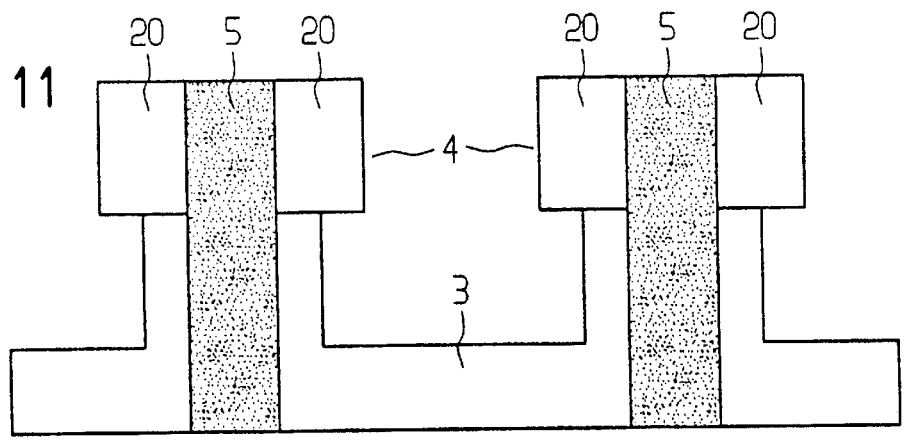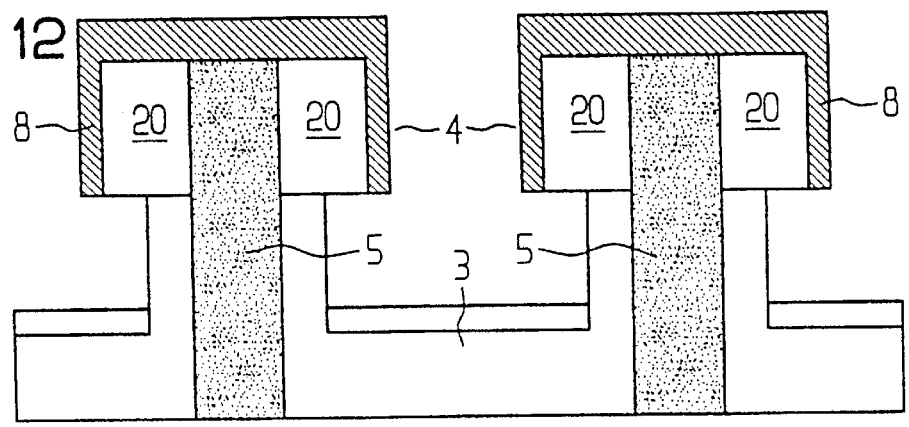

PROCESS FOR PRODUCING STRUCTURED LAYERS, PROCESS FOR PRODUCING COMPONENTS OF AN INTEGRATED CIRCUIT, AND PROCESS FOR PRODUCING A MEMORY CONFIGURATION

BACKGROUND OF THE INVENTION

Field of the Invention

The invention relates to a process for producing structured layers. Such structured layers are used in the semiconductor technology, and are customarily produced with lithographic processes. Generally, a radiation-sensitive resist is structured first and the structure is subsequently transferred to underlying layers in an etching step. Specifically, the following steps are carried out for that purpose:

applying a radiation-sensitive resist on the layer to be structured, irradiating the resist while using a mask for the desired structure, developing the resist layer to produce a resist structure, etching away the layer to be structured at the open regions which are not covered by the developed resist layer, and removing the remaining resist layer.

However, not all layers are compatible with such processes for structuring. This is true, in particular, when material layers that are very difficult to etch are involved, for example noble metals such as Au, Pt or platinum metals such as Ir or Pd as well as various oxide materials such as $IrO_2$ or magnetic materials. In these situations, it is hardly possible to structure the layers or, during the structuring process, only very shallow-sides of the structures or even incorrect structuring such as undesired build-ups are formed. In such a situation, indirect structuring processes such as the so-called "lift-off" process are resorted to. This type of process generally includes the steps:

providing a first layer, structuring the first layer, applying at least one further layer, removing the remaining parts of the first layer, the parts of the at least one further layer which is applied on the first layer being automatically removed as well at these places. This leaves a structured second layer. A problem with this process is, however, the very limited suitability of the process when producing small structures, especially in the sub-μm range. Another problem is that this process is difficult to use in a manufacturing process. Also, the material of the further layer is undesirably redeposited in part when it is removed together with the first layer.

In the field of semiconductor technology, these processes are used to produce individual components such as transistors, capacitors, and so forth. In addition to the problems mentioned above, a further disadvantage of the aforementioned processes is, however, that an elaborate process of applying and removing or eroding of layers is required in each case. Stringent requirements on the selectivity of the layer erosion need to be met specifically in the erosion steps, in order to erode only the desired layer. Further, the lithographic process is of only limited use and fails with a number of materials. These disadvantages can therefore lead to high production costs in component fabrication.

Lastly, there is also the possibility of directly structuring a layer, that is incompatible with any lithographic process, by carrying out layer erosion through ion bombardment or plasma etching. In this case, however, the difficulties arise that the erosion process takes place only slowly, only side edges of low gradient or steepness can be formed, and incorrect structuring can take place through re-deposition of the eroded layer material.

For details of the structuring processes mentioned above, reference is made to the current standard literature on semiconductor technology, such as "Technologie hochintegrierter Schaltungen" (technology for highly integrated circuits), 2nd edition, Springer Publishers, Berlin 1996, D. Widmann, H. Mader, H. Friedrich, pages 29, 101, 102, and 166–168.

SUMMARY OF THE INVENTION

It is accordingly an object of the invention to provide a process for producing structured layers which overcomes the above-mentioned disadvantages of the heretofore-known processes of this general type and which simplifies the process of producing structured layers.

With the foregoing and other objects in view there is provided, in accordance with the invention, a process for producing structured layers, which comprises the steps of providing a base body, in particular a semiconductor body; providing a first layer on the base body; structuring the first layer by an at least partial local layer erosion for forming raised and recessed layer regions with edges formed at transitions between the raised and the recessed layer regions, the first layer being provided as a permanently remaining layer after the structuring step; and applying a second layer on the first layer and separating given layer regions of the second layer from one another using a height difference at the edges of the raised and the recessed regions, the edges of the raised regions acting as partition edges for the second layer.

A particular advantage is that, the first layer remains permanently on the base body after it is structured, and no further erosion of this structured layer is therefore necessary. The actual substrate layer may be used as the first layer in this case. Ideally, a material which allows relatively easy structuring is chosen as the first layer. The structuring of the second or the at least one further layer in individual regions results automatically from the height differences of the surface configuration of the first layer. One only has to take into account that the layer thickness of the further layer must be less than the height difference at the edges which are formed by adjacent raised and recessed regions. Ideally, the height difference between the raised and recessed layer regions is at least twice the layer thickness of the second or further layer, preferably from 2 to 5 times the layer thickness. These edges then act as partition edges, which provide for the separation of the raised regions of the further layer from the recessed regions of this layer in the vicinity of the edges. A particular advantage of this method is that the production of small structures in the layer to be structured is easier than with processes which require local erosion of the layer, and therefore inevitably entail sizable inaccuracies in the structuring of the layer.

Preferably, the first further layer is deposited using an application or deposition process with directional deposition characteristics, for example a collimated sputtering process, on the surface of the first layer, that is to say using a deposition process which ideally deposits only perpendicular to the layer plane. This avoids coating or covering the sides of flanks of the raised and recessed parts of the surface to be coated, and a clear separation of individual regions of the layer is obtained.

A clear separation of the individual layer regions in the vicinity of the edges may, alternatively or additionally, be obtained if, after the deposition of the at least one further layer, suitable layer erosion of the at least one further layer for example an etching step is carried out in order to remove an edge coverage. However, the layer erosion can then be carried out with substantially less stringent requirements on selectivity, edge gradient, or erosion rate than would be the case, for example, with direct structuring of the further layers.

An auxiliary layer may also be provided on the raised parts, which is chemically modified before the deposition of the at least one further layer in such a way that a volume expansion of this auxiliary layer takes place. This auxiliary layer will therefore protrude over the edges of the raised parts of the first layer and thus shades or masks the side edges of the raised parts. This is advantageous, in particular, when it is not possible to achieve the optimum gradient for the side edges, and the side edges therefore cannot be structured ideally perpendicular to the layer surface. Examples of suitable chemical modifications of the auxiliary layer include oxidation and nitriding. Examples of chemically modified auxiliary layers that may be produced thus include $SiO_2$, $Si_3N_4$, $TiO_x$ or $TaO_x$.

In a preferred mode of the invention, the raised parts of the first layer define the functionally active regions of the at least one further layer. In this case, it may be expedient to cover the recessed regions of the at least one further layer in such a way that it is suitable for functionally neutralizing these regions. These regions of a layer that are not needed are therefore neutralized in a relatively uncomplicated way, and are even further isolated from the functionally active regions. Depending on the property of the subsequent layers, this covering may actually be carried out using these subsequent layers themselves. In this case it is preferable, after the erosion of the first further layer, to carry out a conformal deposition of at least one further layer, that is to say this further layer is applied with essentially constant layer thickness over the entire surface. It is, however, also possible to provide a directionally controlled deposition of the further layers.

The described process can be used for producing integrated circuits, for example memory configurations or storage configurations, with the components of the integrated circuit being produced by the structuring of the layers.

With the object of the invention in view there is further provided a process for producing a memory configuration, which comprises providing a semiconductor body; embedding selection transistors in the semiconductor body and in an insulation layer provided on the semiconductor body; and producing electrical components of a memory configuration on a support layer provided on the semiconductor body by depositing further layers on a surface of the support layer and structuring the further layers by structuring the surface of the support layer and forming raised and recessed regions therein, the raised and the recessed regions having edges formed at transitions with a height difference between the raised and the recessed regions, the edges of the raised regions acting as partition edges for at least one of the further layers.

The memory configurations are, in particular, configured such that selection transistors are embedded in a semiconductor body and in an insulation layer applied to the semiconductor body, and electrical components, in particular storage capacitors, are configured on a support layer by depositing further layers for producing the components on the surface of the support layer. In this case, the insulation layer in which the selection transistors are embedded may also be used as the support layer. Structuring of the layers, which make up the components, may then be carried out according to the process of the invention in a straightforward way by structuring the surface of the support layer in raised and recessed regions. In this case, for example, raised parts in the support layer may be structured already in such a way that they directly dictate the shape and position of a component, for example those of a storage capacitor. The component, in this case the storage capacitor, is then created automatically by the subsequent material deposits on the raised part of the support layer.

Thus, in order to produce storage capacitors, a first electrode layer for a first capacitor electrode of the storage capacitors is firstly deposited using an deposition process with directional deposition characteristics, for example by collimated deposition such as a sputtering process, on the surface of the support layer. The storage dielectric as well as a second electrode layer are deposited over this first electrode layer. The deposition of these two layers may be carried out by conformal deposition and by collimated application, with a combination of the two kinds of application being possible. Both dielectric, and ferroelectric substances are preferably provided as the material for the storage dielectric. The electrode material should be tailored to the desired function of the capacitor and the other process parameters for fabricating the memory configuration should also be taken into account when selecting the electrode material as well as the other layers that are used. For example, to produce DRAM OR FRAM memory configurations with a dielectric having a high dielectric constant or a ferroelectric dielectric as the storage dielectric, oxide dielectrics such as SBT $SrBi_2Ta_2O_9$, SBTN $SrBi_2(Ta_{1-x}Nb_x)_2O_9$, PZT $Pb_xZr_{1-x}TiO_3$ or BST $Ba_xSr_{1-x}TiO_3$ with $x \geq$ are possible. Other perovskite-like paraelectric or ferroelectric layers are, however, also conceivable. Since, to produce such storage capacitors for DRAM or FRAM memory configurations, relatively high temperatures of up to 800° C. are necessary, suitable electrode materials such as noble metals or their oxides, for example platinum or platinum metals such as Ru, Os, Rh, Ir or Pd, must correspondingly be used in order to satisfy the stringent requirements when producing the capacitors.

In accordance with another mode of the invention, the raised regions are structured by forming trenches therein, and one of the further layers is conformally deposited with a layer thickness of at least one half of a width of the trenches in a subsequent structuring step.

In accordance with a further mode of the invention, the support layer is electrically connected by structuring a given raised region, providing a conducting connection to the support layer in the given raised region, removing the storage dielectric and the second electrode layer in an area of the given raised region, and connecting the first electrode layer in the area of the given raised region.

Other features which are considered as characteristic for the invention are set forth in the appended claims.

Although the invention is illustrated and described herein as embodied in a process for producing structured layers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a fragmentary, cross-sectional view of a semiconductor structure with a first layer deposited with a collimated process;

FIG. 5 is a fragmentary, cross-sectional view of a semiconductor structure with further layers deposited with a conformal process;

FIG. 6 is a fragmentary, cross-sectional view of a semiconductor structure with further layers deposited with a collimated process;

FIG. 7 is a fragmentary, cross-sectional view of a semiconductor structure with an auxiliary layer deposited on the insulation layer;

FIG. 8 is a fragmentary, cross-sectional view of a semiconductor structure with a chemically modified auxiliary layer after a structuring step for masking the side edges of the structures;

FIG. 9 is a fragmentary, cross-sectional view of a semiconductor structure illustrating a contact connection of a substrate layer;

FIG. 10 is a fragmentary, cross-sectional view of a semiconductor structure illustrating the insulation layer with the auxiliary layer after an unselective etching;

FIG. 11 is a fragmentary, cross-sectional view of a semiconductor structure illustrating the insulation layer with the auxiliary layer after a selective etching of the insulation layer; and FIG. 12 is a fragmentary, cross-sectional view of a semiconductor structure illustrating the insulation layer with the auxiliary layer after an essentially collimated deposition step of a further layer.

DESCRIPTION OF THE PREFERRED EMBODIMENTS

Figure 1:
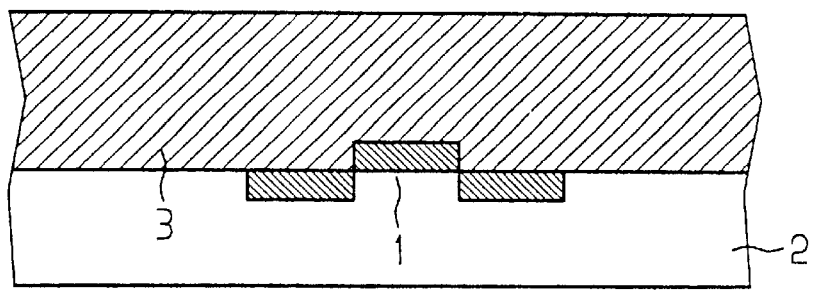
FIG. 1 is a fragmentary, diagrammatic cross-sectional view of a semiconductor body, an insulation layer, and selection transistors.
Figure 2:
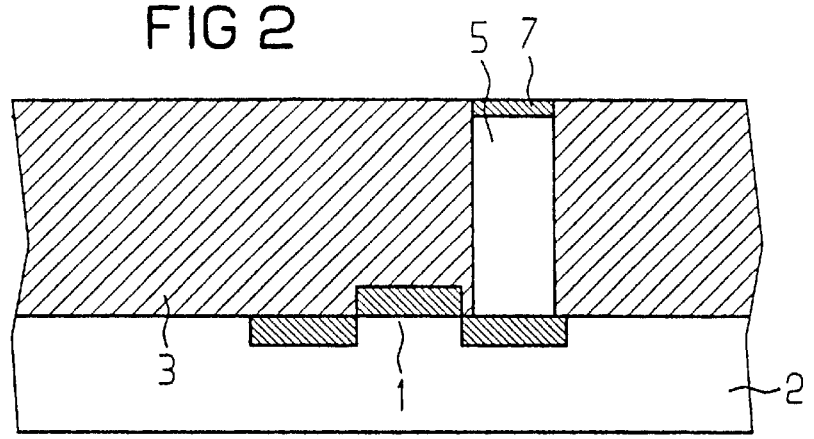
FIG. 2 is a fragmentary, cross-sectional view of the semiconductor body and the insulation layer during the production of a plug connection.
Figure 3:
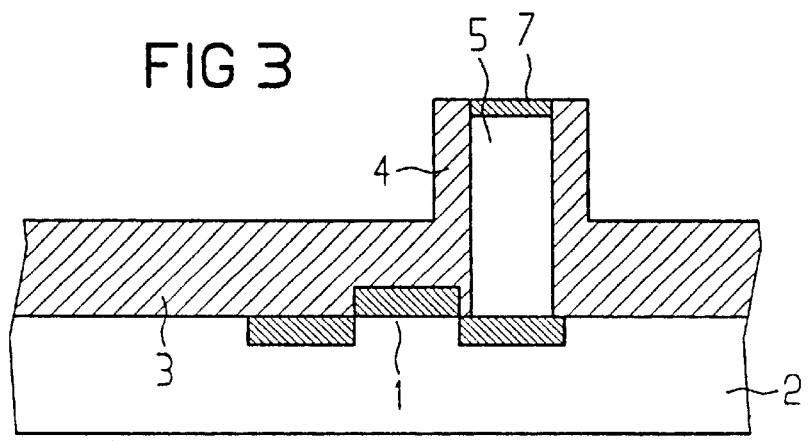
FIG. 3 is a fragmentary, cross-sectional view of a semiconductor structure with a structured insulation layer.

Referring now to the figures of the drawings an exemplary embodiment of the invention is explained with reference to FIGS. 1 and 2. In this case, the production of a memory configuration is explained. The memory configuration has a number of storage cells which have at least one selection transistor as well as a storage capacitor that is electrically connected to the selection transistor. The selection transistor is in this case embedded in a semiconductor body and in an insulation layer applied on top. Further electrical components, for example leads or the storage capacitor of the storage cell, are configured on the insulation layer. Special storage cells are discussed, which have recently gained use, in particular, in FRAMs or DRAMs. These storage cells have dielectrics with a high dielectric constant or have ferroelectrics as the storage dielectric 9 of the storage capacitor 6. To produce such storage capacitors 6, platinum or platinum metals such as Ru, Os, Rh, Ir, or Pd or their oxides such as $IrO_2$ are used as electrode materials for the electrode layers 8, 10 in order to satisfy the stringent requirements when producing the storage capacitors 6. For example, SBT $SrBi_2Ta_2O_9$, SBTN $SrBi_2(Ta_{1-x}Nb_x)_2O_9$, PZT $Pb_xZr_{1-x}TiO_3$ or BST $Ba_xSr_{1-x}TiO_3$ may be used as the storage dielectrics 9.

In order to configure the components, for example the storage capacitors 6, on the insulation layer 3, usually complicated processes for depositing and applying further layers or auxiliary layers on the surface of the insulation layer 3 have until now been necessary. These processes require a significant technical outlay, especially when platinum or platinum metals are used as electrode materials.

The invention can be used to simplify the production of components for storage cells. In order to produce a memory configuration, a structure with selection transistors 1 is firstly produced on a semiconductor body 2 which is covered with an insulation layer 3, for example $SiO_2$. Structuring of the insulation layer is then carried out with a reactive etching using $CF_4$ taking place. The contact holes for the conducting plug connections 5 between the transistors 1 and the storage capacitors 6 are firstly etched in the insulation layer 3 and filled with plug material, and, where appropriate, a barrier layer 7 is deposited on top. The plug material 5 and, if applicable, the barrier layer 7 should preferably terminate level with the surface of the insulation layer 3. Provision may, however, also be made for the plug material 5 to terminate level with the surface of the insulation layer 3, then for the structuring of the insulation layer 3 to be carried out as described below and for the barrier layer 7 to be applied only on the already structured insulation layer 3, that is to say in this case it would lie under the electrode layer 8 shown in FIG. 4.

If, when performing the structuring process, it is not possible to obtain an optimum gradient or steepness for the side edges or flanks of the raised regions 4, provision may be made, after the deposition of the insulation layer 3, also to deposit an auxiliary layer 14 on this insulation layer 3. Ideally the auxiliary layer is made of a material which can be converted by chemical modification into the material of the insulation layer. In the case of an $SiO_2$ insulation layer, a polysilicon auxiliary layer 14 would then be suitable. These two layers are then structured so that the raised regions 4 are formed by the insulation layer 3 with the auxiliary layer 14 applied on top. A chemical modification of the auxiliary layer 14, in this particular case an oxidation, is then carried out with the layer undergoing a volume expansion. In the case of this example, after the oxidation the auxiliary layer and the insulation layer form a physical unit with regard to their materials, so that the auxiliary layer does not give rise to any effects which interfere with the further processes. That region of the insulation layer 3 which corresponds to the oxidized auxiliary layer 14 therefore protrudes beyond the side edges of the raised regions 4 and provides a shading or masking of these side edges. Thus a covering or deposition on the side edges or flanks during the deposition of the electrode layer 8 can be optimally avoided.

Alternatively, it is also possible to select an auxiliary layer 20 with etching properties that differ from the etching properties of the insulation layer 3. FIGS. 10 to 12 show the process steps for this particular case. Firstly, the insulation layer 3 together with the auxiliary layer 20 are etched to form raised regions 4. Selective isotropic etching of the insulation layer 3 is then carried out, with the auxiliary layer 20 remaining substantially unaffected. After this step, the auxiliary layer 20 protrudes beyond the side edges or flanks of the raised regions 4, so that a shading or masking can again be obtained. If a substantially collimated deposition of a further layer 8 is then carried out, which also leads to a partial edge coverage, then only the side edges of flanks of the auxiliary layer 20 are covered. Such a coverage may even be desirable since, when applying an electrode layer 8, the side edges of the auxiliary layer 20 can then also be used as an electrode surface and, in spite of this, a separation of the raised regions 4 from one another can be achieved. Examples of materials which may be used in this case for the auxiliary layer 20 include $Si_3N_4$ and polysilicon.

In the following, however, a configuration according to FIG. 2 will be assumed, in which a barrier layer 7 is applied on the plug material 5 before structuring the insulation layer 7, and no auxiliary layer 14 is provided. The insulation layer 3 is then structured in such a way that raised regions 4 are formed. The future storage capacitors 6 are to be produced on these regions. Further components will for the moment not be considered here. The height of these regions 4 above the rest of the surface should be selected such that it is at least greater than the thickness of the future lower electrode 8 of the capacitor, and alternatively even greater than the total thickness of the future capacitor 6. The height of the regions is preferably 2 to 5 times the thickness of the lower electrode 8. It is also possible to provide a photoresist mask as well, in order to obtain additional structuring of the further layers 8, 9, 10, such as covering decoder zones and separating individual cell arrays. The raised regions 4 may, as represented in the figures, be ridges which are separated from one another by relatively wide recessed regions. It is, however, also possible to separate raised regions 4 by structuring relatively narrow trenches.

By structuring the surface of the insulation layer 3, the entire structure of the components to be configured on the insulation layer 3 can already be established. The insulation layer 3 is in this case generally simpler to structure than the further layers 8, 9, 10, for which reason the solution according to the invention represents a substantial simplification. If the other required layers 8, 9, 10 are deposited on such a structured surface, then the desired layer structures, which can be used as components, are automatically created.

The further layers 8, 9, 10 are then deposited layer by layer. At least the first layer 8, which is used as the lower capacitor electrode and is selected from platinum or platinum metal, is produced by collimated sputtering. However, for the electrode layers 8, 10, in particular for the lower electrode layer 8, it is also possible to provide a multilayer structure of the aforementioned materials, for example of Pt/Ir or Pt/$IrO_2$. Through the collimated sputtering, the layer material is deposited only on the surface regions or zones which are aligned with the target direction. A separation of the various layer regions is consequently obtained by the surface structure. In this case, the collimation substantially prevents deposition of the material on the side walls of the raised parts 4. Preferably layer thicknesses of between 50 and 400 nm are selected for the lower electrode layer and ideally layer thicknesses of between 100 and 200 nm. Layer thicknesses in the 200–400 nm range are advantageous especially when, in order to obtain structures that are as small as possible, efforts are made to produce larger side faces on the lower capacitor electrode, which can then likewise be used as a capacitor surface.

Through a subsequent etching step, for example isotropic wet chemical etching with aqua regia made up of 3 parts HCl and one part $HNO_3$, any undesired edge coverage by the electrode layer 8 can be removed. In this case the etching step may, however, then take place substantially faster and with less stringent requirements on selectivity, edge gradient or etching rate, than is usually the case for structuring the electrode layer 8. For example, an etching step using aqua regia at 70° C. is carried out, which, in the case of a Pt electrode, produces layer erosion of about 10 nm/min. In the case of an electrode layer deposition of about 100 nm thickness with a collimated process, edge coverage of up to about 10% of the layer thickness may still be created depending on the height of the raised structure regions. Thus a one minute etching step is enough to ensure a full removal of the edge coverage. The relatively straightforward isotropic etching process can in this case be used without difficulty since the other regions, which is to say the desired electrode layer regions are only insignificantly affected by this layer erosion and still maintain their functionality.

After the collimated sputtering of the first, inner electrode layer, conformal deposition of the dielectric layer 9 and of the second, outer electrode layer 10 takes place. This permits the additional use of side walls of the first electrode layer 8 as capacitor surface, and therefore an increase in the capacitance. Since the outer electrode layer 8 extends over the entire layer region of the memory configuration, no additional metalization layer is needed for contacting the individual storage capacitors 6.

As an alternative, a collimated application of the dielectric layer as well as the layer for the upper capacitor electrode 10 is provided, which permits a separation of the individual capacitors, although in this case it is no longer possible to use the side walls of the lower capacitor electrode 8. Likewise, in contrast to a conformal layer application, a reduced lateral screening of the lower capacitor electrode 8 with respect to the laterally adjoining regions must then be taken into account, so that additional screening may be required here. Such a deposition process is practical primarily when thin layers 8, 9, 10 are used. For connecting or contacting the individual storage capacitors 6 of the memory configuration, yet another insulation layer 11, in which contact holes 12 to the capacitor electrodes are etched, should in this case be provided over the outer electrode layer 10. This insulation layer can also be used to recreate a level surface over the entire configuration which has so far been structured in raised and recessed regions. If, for example, trenches have been structured in order to produce the raised regions 4, then filling of the trenches and therefore a substantially level surface can be obtained by a conformal deposition of the insulation layer 11 with a layer thickness which is at least one half of the width of the trenches. This may facilitate further process steps such as metalization. This process for producing a level surface can, in principle, be employed in any of the above-described embodiments of the invention, however, it may in particular be used where a structuring of trenches is carried out.

The application of a metalization layer 13, for example of aluminum, which can then be easily structured in the desired way, is then carried out. The application of the insulation layer 11 and of the metalization layer 13 is in this case carried out by conformal deposition. In order to encapsulate the entire configuration, the a further insulation layer (not shown in the figures) over the entire configuration is then applied.

In order to avoid possible crosstalk between neighboring capacitor structures, provision may be made to set the regions of the lower electrode layer 8 to a defined potential, such as 0 V, so that a region with defined potential is formed between the individual capacitors.

The proposed method for producing structured layers can also be used for connecting or electrically contacting the semiconductor body 2. This connection is generally carried out at the periphery of the memory configuration, that is to say outside the region where the storage cells are provided. A removal of the lower electrode layer 8 is in this case not necessary. This is a particular advantage since it is precisely the lower electrode layer 8 which often consists of a material that is more difficult to structure than the rest of the layers. In order to make a connection for contacting, together with the steps of producing the conducting plug connection 5 between the storage capacitor 6 and the transistor 1 as well as the production of the storage capacitor 6 itself, a configuration is produced which is similar but does not have a transistor 1, but instead has a conducting connection 16 formed between the semiconductor body 2 and the lower electrode layer 8. After all the capacitor structures have been fabricated, the outer electrode layer 10 and the dielectric layer 9 are eroded in the vicinity of the contacting connection to the semiconductor body 2. After encapsulation of the configuration, a contact hole 18 to the lower electrode layer 8 can therefore be made in this region, and a metalization 15 which forms the second part of the contact connection to the semiconductor body 2 can be applied. The contact connection of the semiconductor body 2 is thus carried out via the conducting connection 16, via a barrier layer 7 which may possibly be present in a similar fashion as in the configuration of the plug connection 5, via the part of the lower electrode layer 8 configured as a layer island on the raised part, and via the part of the metalization 15 located in the contact hole 18. As a consequence, a part of the lower electrode layer 8 is integrated in the contact connection in a simple manner, rather than removing this layer at a great expense, in order to make a contact hole through all the layers and all the way to the semiconductor body 2 and then fill the contact hole with a metal for connecting the semiconductor body 2.

We claim:

1. A process for producing structured layers, which comprises:
   providing a base body;
   providing a first layer on the base body;
   structuring the first layer by an at least partial local layer erosion for forming raised and recessed layer regions with edges formed at transitions between the raised and the recessed layer regions, the first layer being provided as a permanently remaining layer after the structuring step;
   applying a second layer on the first layer and separating given layer regions of the second layer from one another using a height difference at the edges of the raised and the recessed regions, the edges of the raised regions acting as partition edges for the second layer; and
   defining functionally active regions of the second layer with the raised layer regions of the first layer.

2. The process according to claim 1, wherein the base body is a semiconductor body.

3. The process according to claim 1, wherein the second layer has a thickness of at most half the height difference between the raised and the recessed layer regions.

4. The process according to claim 1, which comprises depositing the second layer on a surface of the first layer with a deposition process having directional deposition characteristics.

5. The process according to claim 1, which comprises eroding the second layer for removing a material coverage on the edges after the step of applying of the second layer.

6. The process according to claim 5, wherein the eroding step is an etching step for removing the material coverage on the edges.

7. The process according to claim 1, which comprises:
   depositing an auxiliary layer on the first layer;
   structuring the auxiliary layer together with the first layer; and
   chemically modifying the auxiliary layer, after the structuring step, such that a volume expansion of the auxiliary layer is provided.

8. The process according to claim 1, which comprises:
   depositing an auxiliary layer on the first layer, the auxiliary layer and the first layer having differing etching properties;
   structuring the auxiliary layer together with the first layer; and
   selectively etching the first layer after the structuring step.

9. The process according to claim 1, which comprises:
   covering recessed layer regions of the second layer, formed by applying the second layer to the recessed layer regions of the first layer, for functionally neutralizing the recessed layer regions of the second layer.

10. The process according to claim 4, which comprises conformally depositing a third layer after the step of depositing the second layer on the surface of the first layer with the deposition process having directional deposition characteristics.

11. A process for producing components of an integrated circuit, which comprises:
    providing a base body;
    providing a first layer on the base body;
    structuring the first layer by an at least partial local layer erosion for forming raised and recessed layer regions with edges formed at transitions between the raised and the recessed layer regions, the first layer being provided as a permanently remaining layer after the structuring step;
    applying a second layer on the first layer and separating given layer regions of the second layer from one another using a height difference at the edges of the raised and the recessed regions for producing components, the edges of the raised regions acting as partition edges for the second layer; and
    defining functionally active regions of the second layer with the raised layer regions of the first layer.

12. A process for producing a memory configuration, which comprises:
    providing a semiconductor body;
    embedding selection transistors in the semiconductor body and in an insulation layer provided on the semiconductor body;
    producing electrical components of a memory configuration on a support layer provided on the semiconductor body by depositing further layers on a surface of the support layer and structuring the further layers by structuring the surface of the support layer and forming raised and recessed regions therein, the raised and the recessed regions having edges formed at transitions with a height difference between the raised and the recessed regions, the edges of the raised regions acting as partition edges for at least one of the further layers; and
    defining functionally active regions of the second layer with the raised layer regions of the first layer.

13. The process according to claim 12, wherein the electrical components are storage capacitors.

14. The process according to claim 12, wherein the raised regions of the support layer define a shape and position of the electrical components of the memory configuration.

15. The process according to claim 13, which comprises depositing a first electrode layer for a first capacitor electrode of the storage capacitors on the surface of the support layer with a deposition process having directional deposition characteristics.

16. The process according to claim 15, wherein the deposition process is a collimated sputtering process.

17. The process according to claim 15, which comprises depositing the first electrode layer as a multilayer structure.

18. The process according to claims 15, which comprises depositing a storage dielectric and a second electrode layer over the first electrode layer.

19. The process according to claim 18, which comprises depositing the storage dielectric and the second electrode layer with one of a conformal deposition process and a directional depositing process.

20. The process according claim 19, wherein the directional deposition process is a collimated sputtering process.

21. The process according to claim 12, which comprises:
structuring the raised regions by forming trenches therein; and
conformally depositing one of the further layers with a layer thickness of at least one half of a width of the trenches in a subsequent structuring step.

22. The process according to claim 18, wherein the storage dielectric of the storage capacitors is selected from the group consisting of paramagnetic materials, paraelectric materials, ferroelectric materials, ferromagnetic materials, and dielectric materials with a high dielectric constant.

23. The process according to claim 18, wherein the storage dielectric of the storage capacitors is selected from the group consisting of $SrBi_2Ta_2O_9$, $SrBi_2(Ta_{1-x}Nb_x)_2O_9$, $Pb_xZr_{1-x}TiO_3$ and $Ba_xSr_{1-x}TiO_3$.

24. The process according to claim 18, wherein at least one of the first and the second electrode layers includes a noble metal.

25. The process according to claim 24, wherein the noble metal is selected from the group consisting of platinum metals and oxides of platinum metals.

26. The process according to claim 25, wherein the platinum metals are selected from the group consisting of Pt, Ru, Os, Rh, Ir, and Pd.

27. The process according to claim 18, which comprises contacting the support layer by structuring a given raised region, providing a conducting connection to the support layer in the given raised region, removing the storage dielectric and the second electrode layer in an area of the given raised region, and connecting the first electrode layer in the area of the given raised region.

* * * * *